United States Patent
Yang et al.

(10) Patent No.: US 10,224,242 B1
(45) Date of Patent: Mar. 5, 2019

(54) LOW-RESISTIVITY METALLIC INTERCONNECT STRUCTURES

(71) Applicant: International Business Machines Corporation, Armonk, NY (US)

(72) Inventors: Chih-Chao Yang, Glenmont, NY (US); Stephan A. Cohen, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/812,033

(22) Filed: Nov. 14, 2017

(51) Int. Cl.
| | |
|---|---|
| *H01L 21/768* | (2006.01) |
| *H01L 23/532* | (2006.01) |
| *H01L 23/528* | (2006.01) |
| *H01L 21/3213* | (2006.01) |
| *H01L 21/311* | (2006.01) |

(52) U.S. Cl.
CPC .... *H01L 21/76885* (2013.01); *H01L 21/7682* (2013.01); *H01L 21/76852* (2013.01); *H01L 21/76871* (2013.01); *H01L 21/76886* (2013.01); *H01L 23/5283* (2013.01); *H01L 23/53238* (2013.01); *H01L 21/31116* (2013.01); *H01L 21/32134* (2013.01)

(58) Field of Classification Search
CPC combination set(s) only.
See application file for complete search history.

(56) References Cited

U.S. PATENT DOCUMENTS

| | | | |
|---|---|---|---|
| 6,570,255 B2 | 5/2003 | Andricacos et al. | |
| 8,852,305 B2 | 10/2014 | Andersson et al. | |
| 8,864,861 B2 | 10/2014 | Andersson et al. | |
| 8,888,841 B2 | 11/2014 | Pandelidis et al. | |
| 8,893,711 B2 | 11/2014 | Kennedy | |
| 8,895,099 B2 | 11/2014 | Atanasoska et al. | |

(Continued)

OTHER PUBLICATIONS

S. Kincal et al., "RC Performance Evaluation of Interconnect Architecture Options Beyond the 10-nm Logic Node," IEEE Transactions on Electron Devices, Jun. 2014, pp. 1914-1919, vol. 61, No. 6.

(Continued)

*Primary Examiner* — Ratisha Mehta
(74) *Attorney, Agent, or Firm* — L. Jeffrey Kelly; Ryan, Mason & Lewis, LLP

(57) ABSTRACT

Semiconductor devices with low-resistivity metallic interconnect structures are provided. For example, a sacrificial dielectric layer is formed on a substrate, and patterned to form an opening in the sacrificial dielectric layer. The opening is filled with a metallic material to form a metallic interconnect structure, and the sacrificial dielectric layer is removed to expose the metallic interconnect structure. A heat treatment process is applied to the exposed metallic interconnect structure to modulate a microstructure of the metallic material of the metallic interconnect structure from a first microstructure to a second microstructure. A conformal liner layer is selectively deposited on exposed surfaces of the metallic interconnect structure, subsequent to the heat treatment process. A dielectric layer is formed to encapsulate the metallic interconnect structure in dielectric material, wherein the conformal liner layer serves as a diffusion barrier layer between the metallic interconnect structure and the dielectric layer.

20 Claims, 12 Drawing Sheets

(56) References Cited

U.S. PATENT DOCUMENTS

| | | | |
|---|---|---|---|
| 8,900,990 | B2 | 12/2014 | Zhang et al. |
| 8,993,472 | B2 | 3/2015 | Roller et al. |
| 9,005,769 | B2 | 4/2015 | Lambert et al. |
| 9,017,762 | B2 | 4/2015 | Rozak et al. |
| 9,023,486 | B2 | 5/2015 | Nagaraj et al. |
| 9,031,184 | B2 | 5/2015 | Cabrero et al. |
| 9,034,465 | B2 | 5/2015 | Peters et al. |
| 9,034,479 | B2 | 5/2015 | Nagaraj et al. |
| 9,412,658 | B2 | 8/2016 | Gluschenkov et al. |
| 2010/0093168 | A1* | 4/2010 | Naik ............... H01L 21/31144 438/618 |
| 2010/0330799 | A1 | 12/2010 | Hamanaka et al. |
| 2011/0195570 | A1* | 8/2011 | Lin ................... C23C 14/022 438/652 |
| 2012/0319282 | A1* | 12/2012 | Uzoh ............... H01L 21/76883 257/763 |
| 2014/0301861 | A1 | 10/2014 | Bruce et al. |
| 2014/0324156 | A1 | 10/2014 | Yin et al. |
| 2015/0129087 | A1 | 5/2015 | Hintz |
| 2015/0132962 | A1 | 5/2015 | Hu et al. |
| 2015/0287634 | A1 | 10/2015 | Agarwal et al. |
| 2016/0270237 | A1 | 9/2016 | Cho et al. |
| 2017/0179023 | A1 | 6/2017 | Bruce et al. |
| 2017/0256498 | A1 | 9/2017 | Standaert et al. |
| 2017/0287784 | A1 | 10/2017 | Leobandung |

OTHER PUBLICATIONS

Disclosed Anonymously, "Method for a Cu Interconnects System with Low Line Resistivity and Enhanced EM Resistance," ip.com, IPCOM000132112D, Dec. 1, 2005, 7 pages.

Prof. Saraswat, "Interconnections: Copper & Low Dielectrics," https://web.stanford.edu/class/ee311/NOTES/Interconnect_Cu.pdf, Nov. 12, 2017, 22 pages.

P.Y. Zheng et al., "Ni Doping on Cu Surfaces: Reduced Copper Resistivity," Applied Physics Letters, Oct. 1, 2014, pp. 131603-131603.5, vol. 105, No. 13.

* cited by examiner

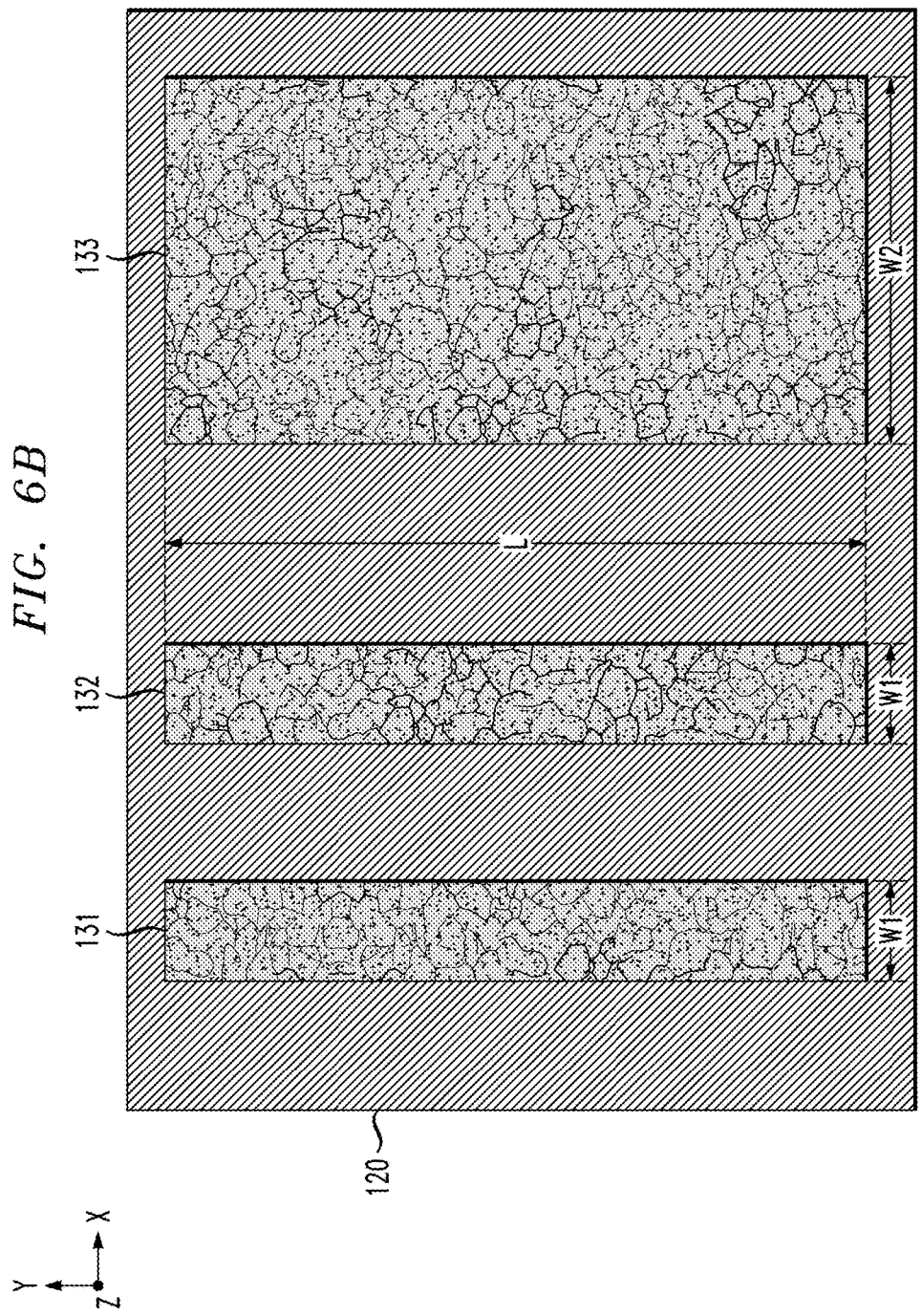

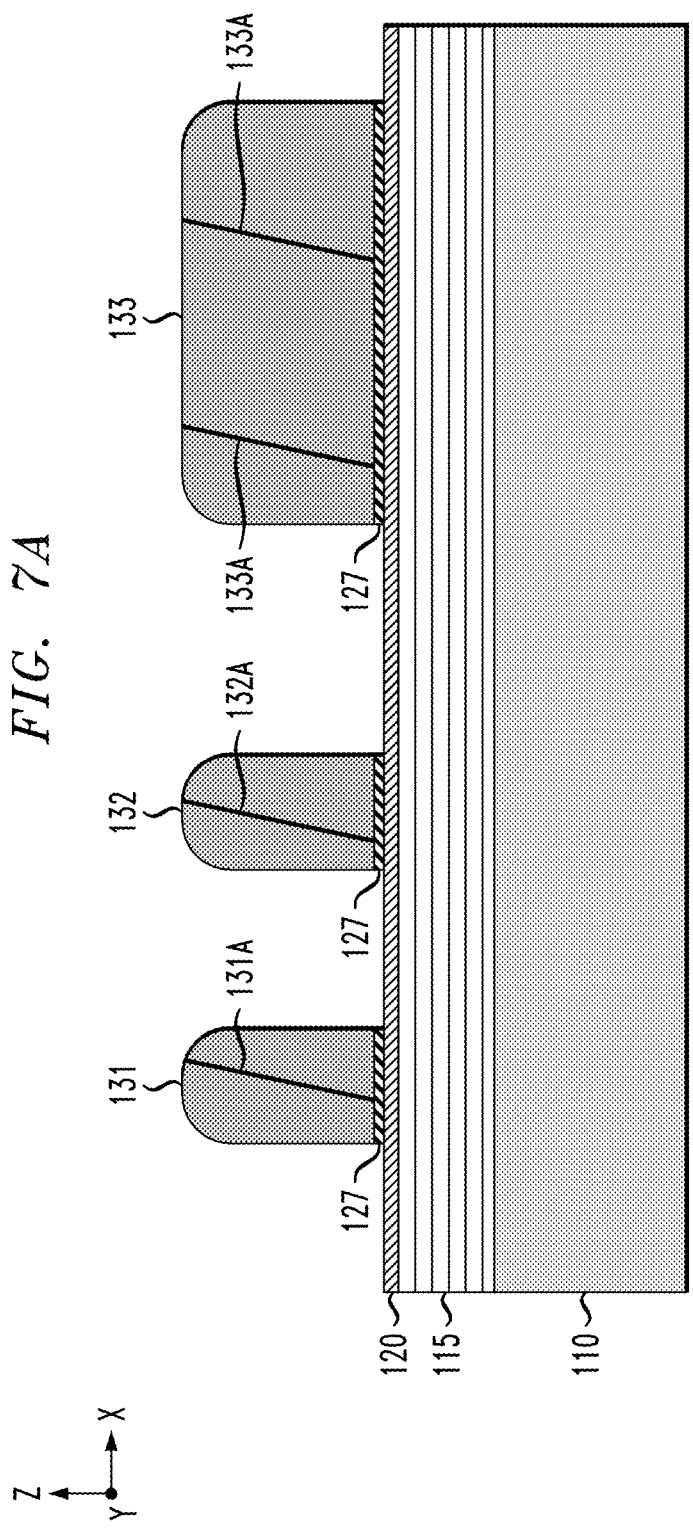

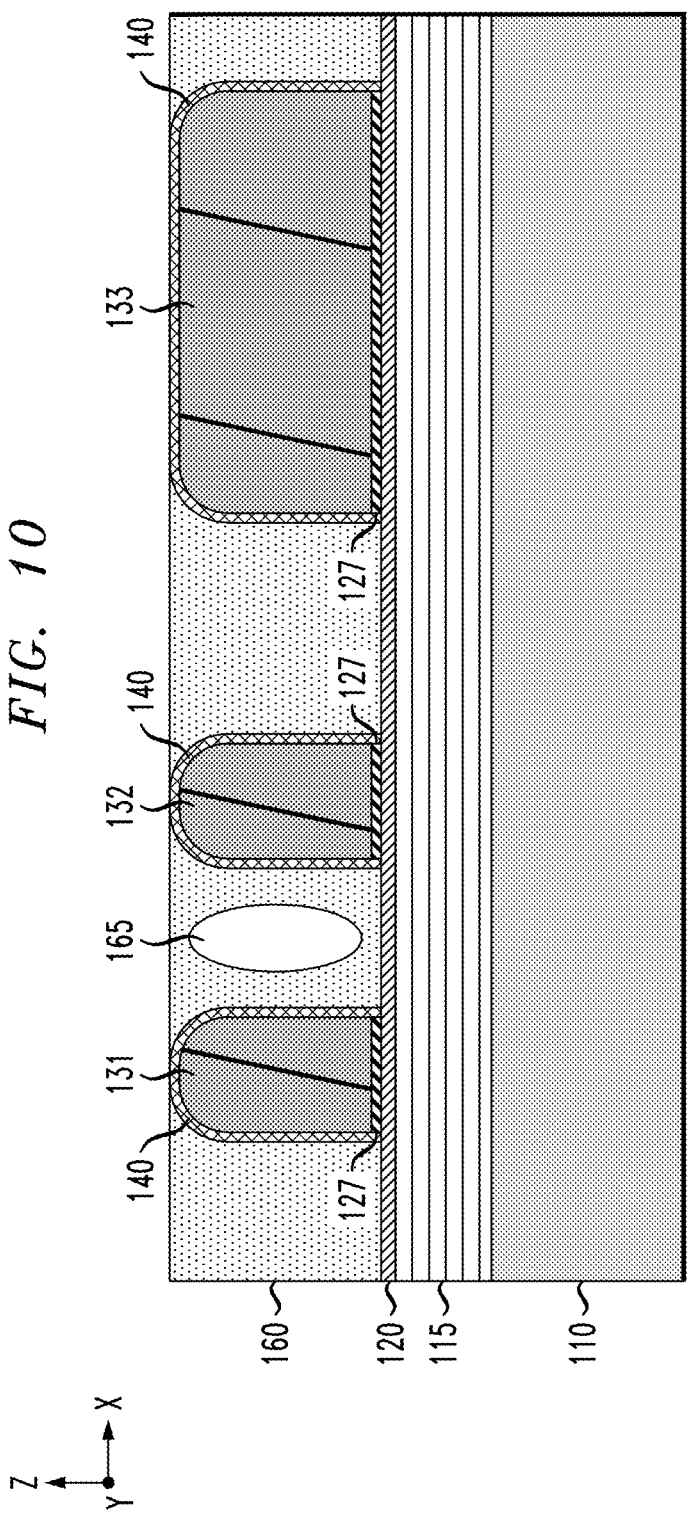

LOW-RESISTIVITY METALLIC INTERCONNECT STRUCTURES

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper material is known to significantly reduce resistance in the BEOL interconnect structure, resulting in improved conduction and higher performance. As copper interconnect structures are scaled down, however, there is a significant increase in the resistivity and current density within the copper interconnect structures, which is undesirable. The increase in current density in copper interconnect structures causes an increase in the current-driven electromigration of copper atoms. In the context of copper interconnect structures, electromigration is the transport of copper atoms caused by the gradual movement of ions in the copper material due to momentum transfer between conducting electrons and diffusing copper atoms. The electromigration of copper atoms can lead to various defects in copper interconnect structures such as voids and hillock defects.

Based on Matthiessen's Rule (an empirical rule), the total resistivity $\rho_t$ of a given metallic material is the sum of a bulk resistivity $\rho_b$ of the metallic material, a resistivity $\rho_s$ of the metallic material due to surface scattering of conduction electrons, and a resistivity $\rho_g$ of the metallic material due to scattering of conduction electrons at grain boundaries, i.e., $\rho_t = \rho_b + \rho_s + \rho_g$. In this regard, the electrical resistivity of a metallic interconnect structure depends, in part, on a grain microstructure of the metallic material which forms the metallic interconnect structure. For example, a polycrystalline microstructure is one which comprises many crystallites (or grains) of varying size and orientation, and with random texture and no grain direction. A polycrystalline microstructure tends to decrease the electrical conductivity of the metallic material, as well as increase electromigration within the metallic material due to the electron diffusion paths that exist along the various grain boundaries in the polycrystalline metallic material. In addition, it is known that the electrical resistivity of a narrow metal wire is significantly affected by electron surface scattering if the cross-sectional dimension of the metal wire is smaller than the mean free path for electron-phonon collisions. The resulting increase in resistivity in metallic interconnect structures with smaller dimensions is a major challenge for nano-scaling of BEOL interconnect structures.

SUMMARY

Embodiments of the invention include methods for fabricating low-resistivity metallic interconnect structures, and semiconductor devices comprising low-resistivity metallic interconnect structures. One embodiment includes a method for fabricating a metallic interconnect structure. The method comprises forming a sacrificial dielectric layer on a substrate, and patterning the sacrificial dielectric layer to form an opening in the sacrificial dielectric layer. The opening is filled with a metallic material to form a metallic interconnect structure, and the sacrificial dielectric layer is removed to expose the metallic interconnect structure. A heat treatment process is applied to the exposed metallic interconnect structure to modulate a microstructure of the metallic material of the metallic interconnect structure from a first microstructure to a second microstructure, and a conformal liner layer is selectively deposited on exposed surfaces of the metallic interconnect structure, subsequent to the heat treatment process. A dielectric layer is formed to encapsulate the metallic interconnect structure in dielectric material, wherein the conformal liner layer serves as a diffusion barrier layer between the metallic interconnect structure and the dielectric layer.

Another embodiment includes a device, which comprises a dielectric layer disposed on a substrate, and a metallic interconnect structure encapsulated in the dielectric layer. The metallic interconnect structure comprises a conformal liner layer formed on an upper surface and sidewall surfaces of the metallic interconnect structure, wherein the conformal liner layer comprises a diffusion barrier layer between the metallic interconnect structure and the dielectric layer. The metallic interconnect structure comprises metallic material having an average grain size which is greater than a critical dimension of metallic interconnect structure, and the metallic interconnect structure comprises a rounded upper surface.

Other embodiments will be described in the following detailed description of embodiments, which is to be read in conjunction with the accompanying figures.

BRIEF DESCRIPTION OF THE DRAWINGS

FIGS. 1 through 10 schematically illustrate methods for fabricating a device with low-resistivity metallic interconnect structures according to embodiments of the invention, wherein:

FIG. 1 is a schematic cross-sectional side view of a semiconductor device at an intermediate stage of fabrication in which a sacrificial dielectric layer is formed on a substrate;

FIG. 2 is a schematic cross-sectional side view of the semiconductor device shown in FIG. 1 after patterning the sacrificial dielectric layer to form a plurality of openings in the sacrificial dielectric layer;

FIG. 3 is a schematic cross-sectional side view of the semiconductor device shown in FIG. 2 after forming a conformal seed layer over the surface of the semiconductor device;

FIG. 4 is a schematic cross-sectional side view of the semiconductor device shown in FIG. 3 after forming a layer of metallic material to fill the openings in the sacrificial dielectric layer with metallic material;

FIG. 5 is schematic cross-sectional side view of the semiconductor device shown in FIG. 4 after planarizing the surface of the semiconductor device down to the sacrificial dielectric layer to remove overburden portions of the seed layer and the metallic layer, and form metallic lines;

FIGS. 6A and 6B are schematic views of the semiconductor device shown in FIG. 5 after etching away the sacrificial dielectric layer and portions of the seed layer to expose the metallic lines;

FIGS. 7A and 7B are schematic views of the semiconductor device shown in FIGS. 6A and 6B, respectively, after performing a heat treatment process to modulate the microstructure of the metallic material of the metallic lines from a polycrystalline microstructure to a microstructure comprising larger grains;

FIG. 8 is a schematic cross-sectional side view of the semiconductor device shown in FIG. 7A after forming a liner layer on exposed surfaces of the metallic lines;

FIG. 9 is a schematic cross-sectional side view of the semiconductor device shown in FIG. 8 after forming an interlevel dielectric layer to encapsulate the metallic lines in dielectric material; and FIG. 10 is a schematic cross-sectional side view of the semiconductor device shown in FIG. 8 after forming an interlevel dielectric layer to encapsulate the metallic lines in dielectric material, with an air gap formed in the dielectric material between adjacent metallic lines.

DETAILED DESCRIPTION

Figure 1:
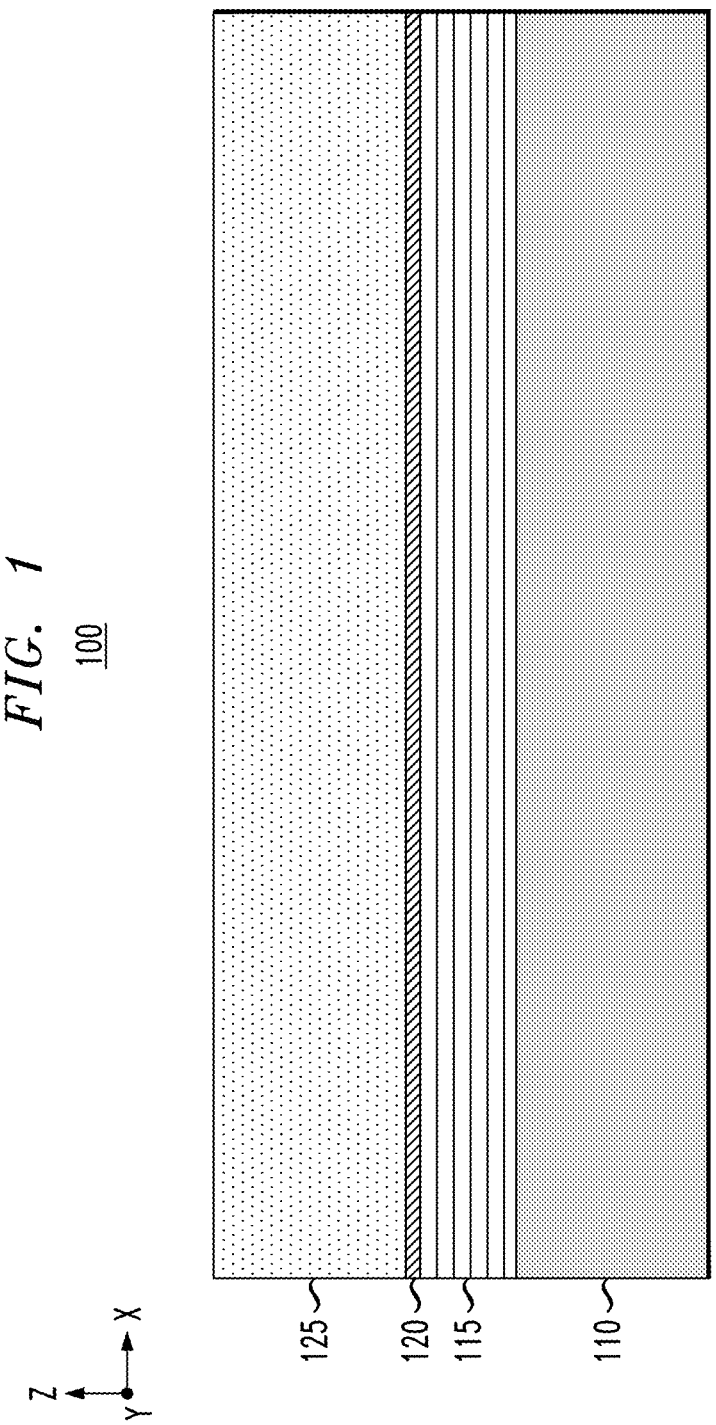

Embodiments will now be described in further detail with regard to semiconductor devices comprising low-resistivity metallic interconnect structures, as well as methods for fabricating low-resistivity metallic interconnect structures. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Methods for fabricating low-resistivity metallic interconnect structures will now be discussed in further detail with reference to FIGS. 1 through 10, which schematically illustrate a semiconductor device at various stages of fabrication. To begin, FIG. 1 is a schematic cross-sectional side view of a semiconductor device 100 at an intermediate stage of fabrication comprising a semiconductor substrate 110 (e.g., semiconductor wafer), a FEOL (front-end-of-line)/MOL (middle-of-line) structure 115 formed on the semiconductor substrate 110, a capping layer 120, and a sacrificial dielectric layer 125. While the semiconductor substrate 110 is illustrated as a generic substrate layer, it is to be understood that the semiconductor substrate 110 may comprise one of different types of semiconductor substrate structures and materials.

For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. It is to be noted that in each drawing, the X-Y plane represents a plane that is parallel to the plane of the semiconductor substrate 110 (e.g., wafer) being processed.

The FEOL/MOL structure 115 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 115 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 115.

In the example process flow illustrated in FIG. 1, the capping layer 120 and sacrificial dielectric layer 125 are formed as part of an initial phase of a BEOL process module to form a first metallization level of a BEOL interconnect structure. The capping layer 120 comprises a layer of insulating/dielectric material such as silicon nitride (SiN), silicon carbide (SiC), silicon carbon nitride (SiCN), hydrogenated silicon carbide (SiCH), or a multilayer stack comprising the same or different types of dielectric materials, etc., or other suitable low-k dielectric materials which are non-reactive with the metallic material that is used to form metallic interconnect structures in the BEOL. In one example embodiment, the capping layer 120 is formed with a thickness in a range of about 2 nm to about 60 nm. The sacrificial dielectric layer 125 can be formed of a dielectric material including, but not limited to, silicon oxide (e.g. $SiO_2$), SiN, silanol (SiOH), hydrogenated silicon nitride (SiNH), and other similar types of insulating/dielectric materials or porous dielectrics. The thickness of the sacrificial dielectric layer 125 defines a vertical height (or thickness) of the metallization that is formed within the sacrificial dielectric layer 125, which will vary depending on the application. For example, in one embodiment, the sacrificial dielectric layer 125 is formed with a thickness in a range of about 20 nm to about 800 nm. The capping layer 120 and sacrificial dielectric layer 125 are formed using known deposition techniques, such as, for example, ALD (atomic layer deposition), CVD (chemical vapor deposition) PECVD (plasma-enhanced CVD), or PVD (physical vapor deposition), or spin-on deposition.

Figure 2:
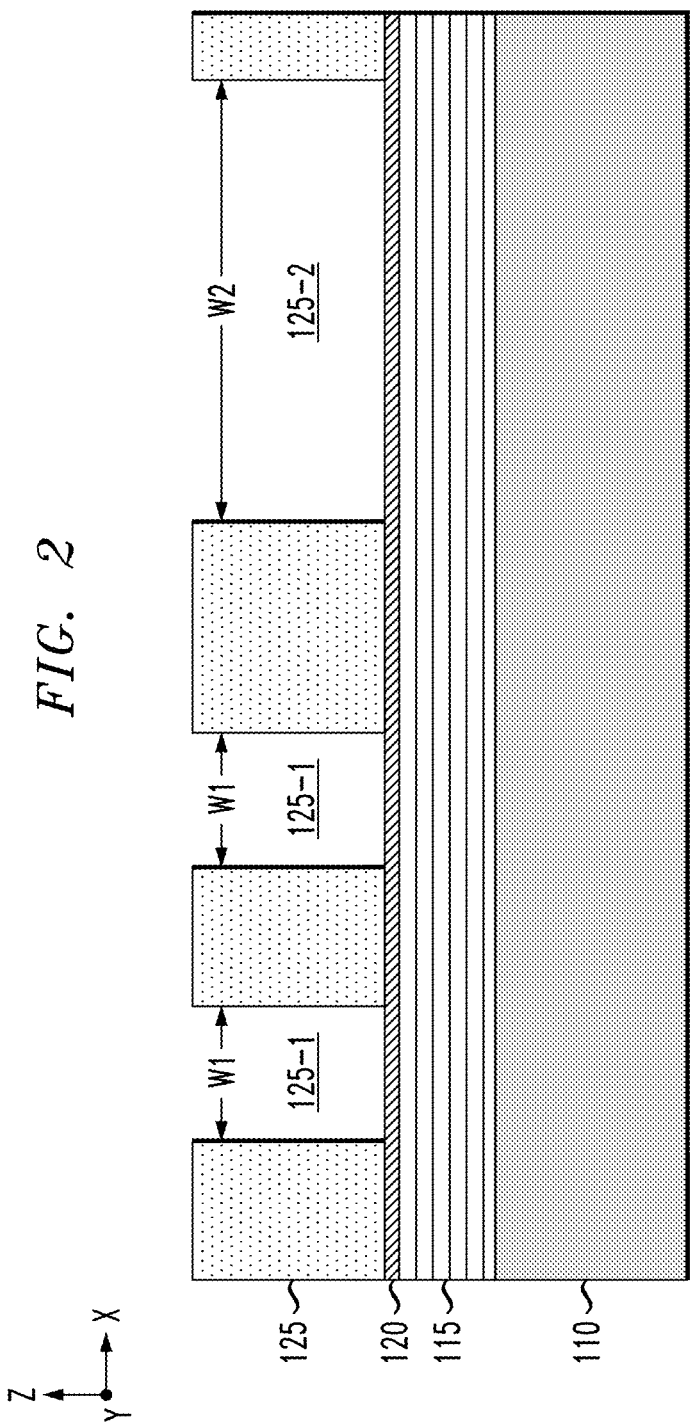

Next, FIG. 2 is a schematic cross-sectional side view of the semiconductor device shown in FIG. 1 after patterning the sacrificial dielectric layer 125 to form a plurality of openings 125-1 and 125-2 (e.g., trench openings) in the sacrificial dielectric layer 125. In particular, in the example embodiment, the openings 125-1 define narrow metal lines to be formed with a first width W1, and the opening 125-2 defines a wide metal line to be formed with a second width W2, which is greater than W1. In one embodiment, the first width W1 is in a range of about 48 nm or less, and the second width W2 is in a range of about 2×W1 or greater. In the example embodiment of FIG. 2, the width W1 of the openings 125-1 defines a "critical dimension" (CD) of metal wiring which is subsequently formed by filling the openings 125-1 with metallic material. In this regard, the first width W1 is fixed by the CD of the particular fabrication process that is implemented, and the second width W1 can be, e.g., an integer multiple (e.g., 2×, 3×, etc.) of the first width W1.

For illustrative purposes, FIG. 2 shows the use of a single damascene process in which metallic interconnect structures, e.g., metallic lines (wiring) and metallic vias (vertical interconnects) are separately formed in different insulating layers of a BEOL structure. In other embodiments, openings can be etched in the sacrificial dielectric layer 125 and filled with metallic material using one of various "dual" damascene patterning techniques known in the art in which trenches and via openings are patterned in the same dielectric layer and concurrently filled with metallic material. The dual damascene patterning methods include a "via first" process, a "trench first" process, and a "buried via" process, each of which comprising different sequences for etching the dielectric layer 125 to pattern the via openings and trench openings, while concurrently filling the via openings and trench openings with metallic material.

The damascene patterning of the sacrificial dielectric layer 125 can be implemented using any conventional photolithography and etching process, e.g., forming a photoresist mask on the upper surface of the sacrificial dielectric layer 125 which comprises an image of the openings 125-1 and 125-2 to be etched into the sacrificial dielectric layer 125, followed by etching the dielectric material of the sacrificial dielectric layer 125 using a dry etch process such as RIE (reactive ion etching), which has an etch chemistry that is suitable to etch the sacrificial dielectric layer 125 selective to the underlying capping layer 120 (which serves as an etch stop layer). The capping layer 120 insulates the metallization from the underlying PMD layer of the FEOL/MOL layer 115. However, in target locations where the metallization formed in the openings 125-1 and 125-2 will make contact to vertical contacts formed in the underlying FEOL/MOL layer 115, the capping layer 120 can be patterned by etching openings through the capping layer 120 at the bottom of the openings 125-1 and 125-2 at such target locations.

Figure 3:
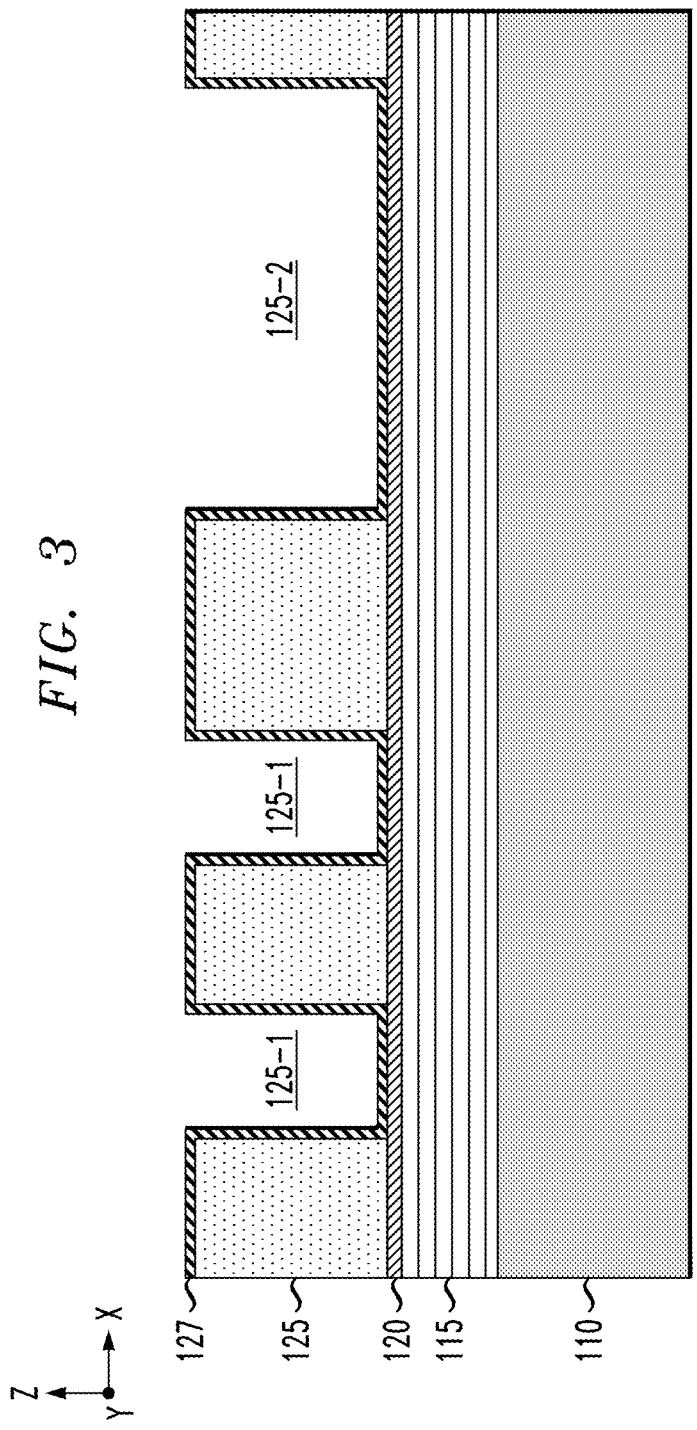

Next, FIG. 3 is a schematic cross-sectional side view of the semiconductor device shown in FIG. 2 after forming a conformal seed layer 127 over the surface of the semiconductor device. The seed layer 127 is an optional layer that is formed to serve as a plating seed layer in embodiments wherein metallic material is deposited in the openings 125-1 and 125-2 using electroplating techniques to form metal lines. The seed layer 127 may comprises one of copper (Cu), tantalum (Ta), titanium (Ti), cobalt (Co), ruthenium (Ru), tantalum nitride (TaN), titanium nitride (TiN), cobalt nitride (CoN), ruthenium nitride (RuN), or any other types of metallic material or alloys which are suitable to serve as a seeding layer for a subsequent electroplating process. In conventional BEOL techniques in which a non-sacrificial interlevel dielectric (ILD) layer would be formed (instead of the sacrificial dielectric layer 125), a thin layer of liner material would be deposited at this point in the process flow to line the sidewall and bottom surfaces of the openings 125-1 and 125-2 with liner material. The liner layer in this instance would serve as a barrier diffusion layer to prevent diffusion of metallic material into the ILD layer, with an optional seed layer formed over the liner layer. However, as explained in further detail below, in accordance with embodiments of the invention, the sacrificial dielectric layer 125 is removed in a subsequent process flow, and a barrier diffusion layer is selectively deposited on exposed surfaces of metallization structures prior to forming an ILD layer.

Figure 4:
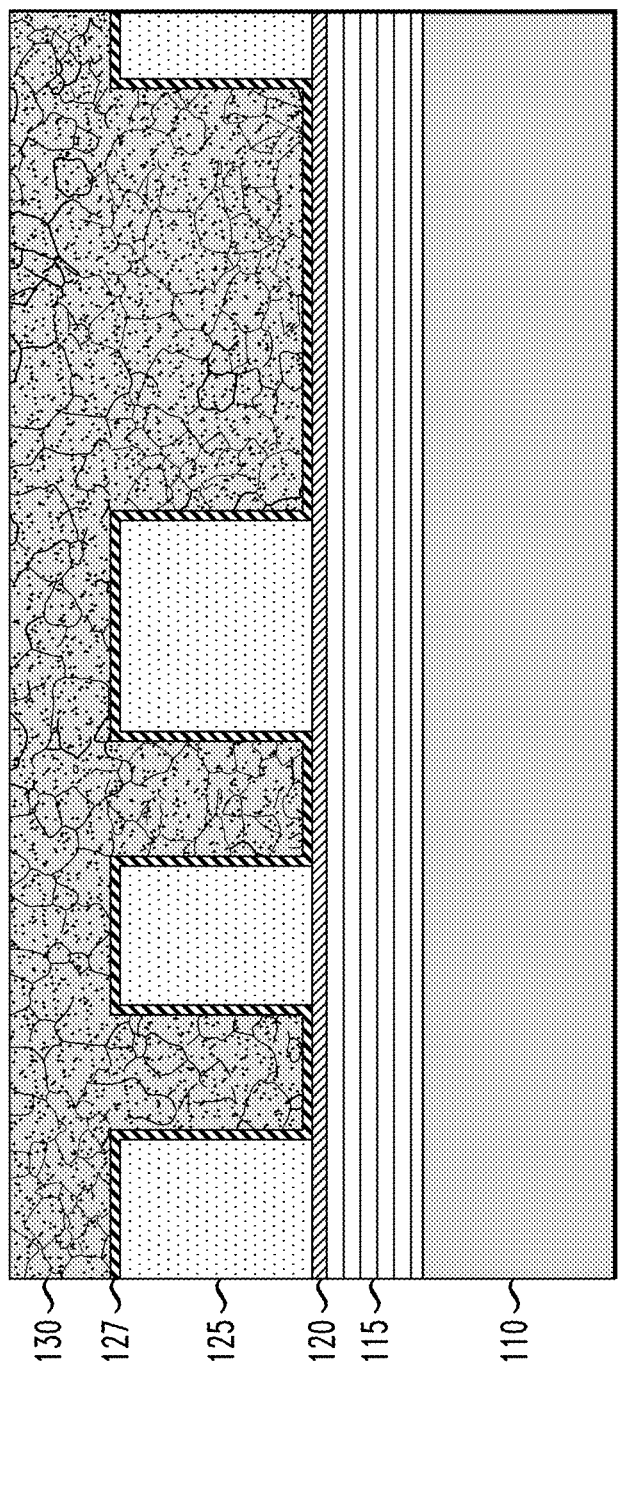
Figure 5:
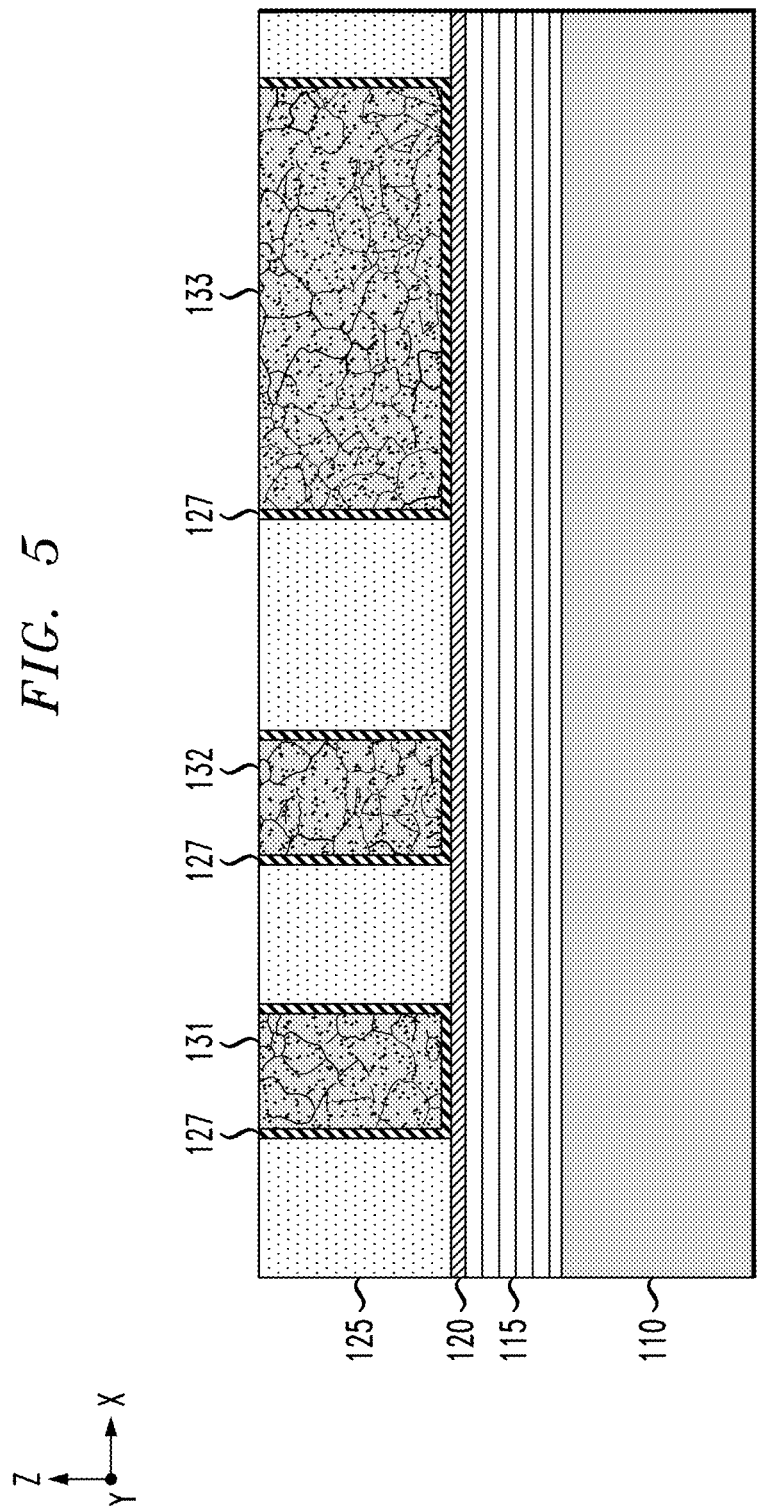

A next phase of the process flow comprises depositing a layer of metallic material to form metallic interconnect structures (e.g., metallic lines) in the sacrificial dielectric layer 125, as schematically illustrated in FIGS. 4 and 5. In particular, FIG. 4 is a schematic cross-sectional side view of the semiconductor device shown in FIG. 3 after forming a layer of metallic material 130 to fill the openings 125-1 and 125-2 in the sacrificial dielectric layer 125 with metallic material, and FIG. 5 is schematic cross-sectional side view of the semiconductor device shown in FIG. 4 after planarizing the surface of the semiconductor device down to the sacrificial dielectric layer 125 to remove overburden portions of the seed layer 127 and the metallic layer 130, and form a plurality of metallic lines 131, 132, and 133. In one embodiment of the invention, the layer of metallic material 130 comprises Cu. In other embodiments, the metallic material 130 can be, for example, aluminum (Al), tungsten (W), iridium (Ir), cobalt (Co), ruthenium (Ru), or alloys thereof. The layer of metallic material 130 is deposited using known dry deposition techniques such as ALD, PVD or CVD or wet deposition techniques such as electroplating, and electroless plating, etc. The planarization process can be implemented using a chemical-mechanical polish (CMP) process with a suitable etch slurry.

In an exemplary embodiment where the layer of metallic material 130 comprises electroplated copper, for example, the copper metallic material 130 as deposited comprises a polycrystalline microstructure, as schematically illustrated in FIGS. 4 and 5. The polycrystalline microstructure comprises a mosaic of very small single crystals, which are randomly distributed with no preferred orientation. The polycrystalline microstructure comprises many grain boundaries, which tends to decrease the electrical conductivity of the metallic material, and tends to enhance electromigration due to grain boundary diffusion of electrons, which is not desirable. Accordingly, as explained in further detail below, to further reduce the electrical resistivity of the metallic wiring 131, 132 and 133, the metallic material of the wiring 131, 132, and 133 is subjected to a heat treatment to convert the polycrystalline microstructure of the metallic material into a different microstructure comprising larger grains with a given grain direction. For example, in one embodiment, the polycrystalline microstructure is converted into a "bamboo" or "columnar" microstructure, having large elongated grains that extend in a particular direction.

Figure 6A:
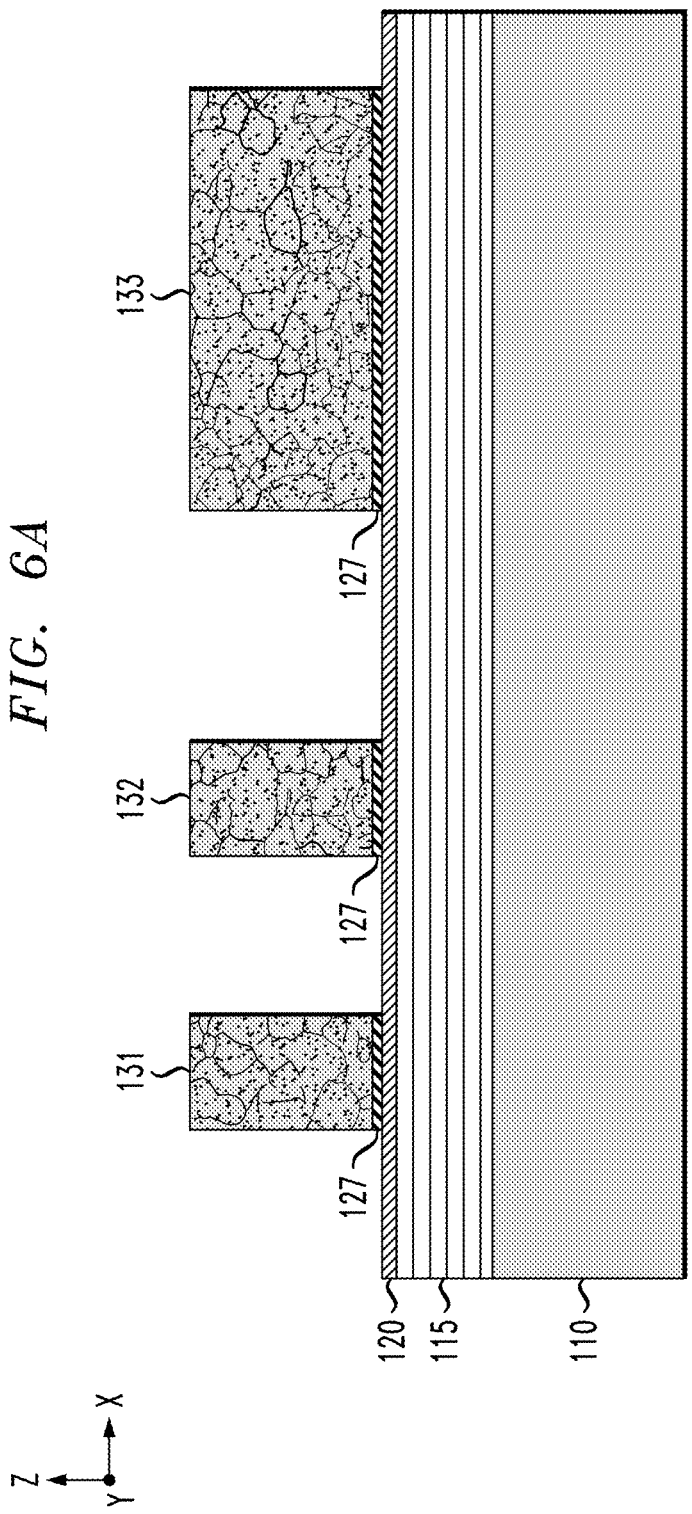

A next phase of the process flow comprises removing the sacrificial dielectric layer 125 and portions of the seed layer 127 on the sidewalls of the metallic lines 131, 132 and 133, as schematically illustrated in FIGS. 6A and 6B. In particular, FIG. 6A is a schematic cross-sectional side view of the semiconductor device shown in FIG. 5 after etching away the sacrificial dielectric layer 125 and exposed portions of the seed layer 127, and FIG. 6B is a schematic top plan view (X-Y plane) of the semiconductor device shown in FIG. 6A. The sacrificial dielectric layer 125 can be removed using any suitable dry etch process, such as a plasma etch process with a chlorine (Cl), fluorine (F), or a carbon tetrafluoride ($CF_4$) plasma gas. The seed layer 127 can be etched away using any suitable wet etch process using, for example, hydrogen fluoride (HF), hydrogen chloride (HCL), or a mixture of sulfuric acid ($H_2SO_4$) and hydrogen peroxide ($H_2O_2$).

As shown in FIGS. 6A and 6B, removal of the sacrificial dielectric layer 125 and the portions of the seed layer 127 on the vertical sidewalls of the metallic lines 131, 132, and 133 results in the exposing all surfaces of the metallic lines 131, 132, and 133, except for the bottom surfaces of the metal lines 131, 132, 133. This exposure provides a larger surface area to which heat can be applied to facilitate and promote grain growth of the metallic material from upper and sidewall surfaces of the metal lines 131, 132, and 133 during a subsequent heat treatment process (e.g., thermal anneal), wherein the polycrystalline microstructure of metallic lines 131, 132 and 133 is converted to a microstructure comprising larger grains with a given grain direction.

Figure 7B:
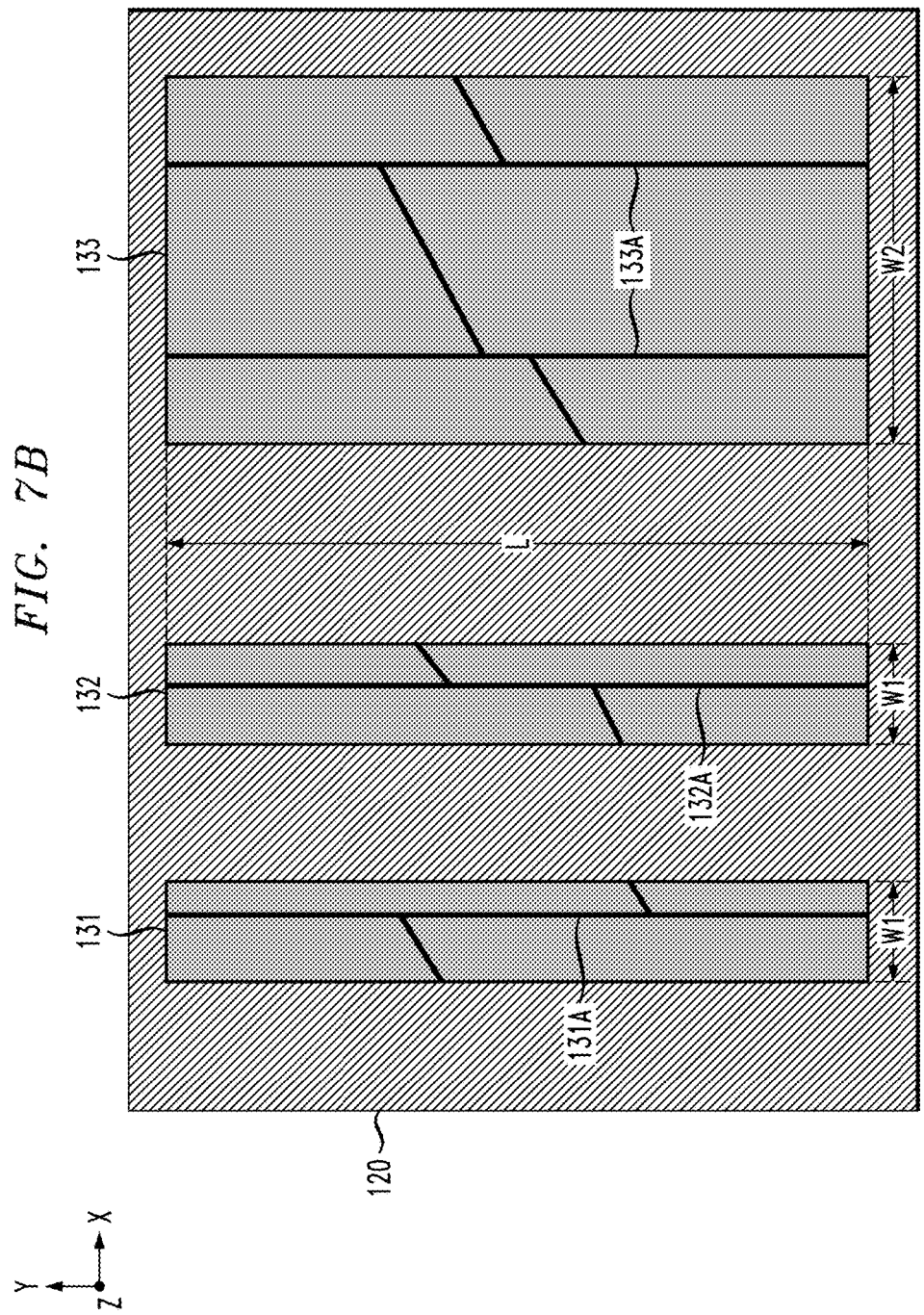

In particular, FIGS. 7A and 7B are schematic views of the semiconductor device shown in FIGS. 6A and 6B, respectively, after applying a heat treatment process to the metallic lines 131, 132 and 133 to modulate the microstructure of the metallic material from a polycrystalline microstructure to microstructure comprising larger grains that are defined by grain boundaries 131A, 132A, and 133A. In particular, the grain microstructure of the metallic lines 131, 132 and 133 comprises large grains that are separated by respective grain boundaries 131A, 132A, and 133A, which extend in substantially the same direction (e.g., in a substantially vertical direction), providing a columnar or bamboo microstructure. As schematically shown in FIG. 7A, the ends of the grain boundaries 131A, 132A, and 133A extend from the upper surfaces to the lower surfaces of the metallic lines 131, 132, and 133. The example microstructure shown in FIGS. 7A and 7B serves to minimize electromigration since the grain boundaries 131A, 132A, and 133A extend in a substantially vertical direction (Z-direction) which is essentially perpendicular to a length direction L (see FIG. 7B) in which electrical current would flow within the metallic lines 131, 132, and 133 during operation.

The heat treatment that is applied to the metallic lines 131, 132, and 133 to convert the polycrystalline microstructure of the metallic material to a microstructure comprising larger grains can be implemented using various techniques. For example, in one embodiment of the invention, the semiconductor device shown in FIGS. 6A and 6B can be placed in a furnace and subjected to a thermal anneal process in a temperature range of about 100 degrees Celsius to about 500 degrees Celsius for a period of about 20 minutes to about five hours. In another embodiment, a laser process can be implemented using known methods in which a laser beam (e.g., pulsed beam) is directed at the exposed surfaces of the metallic lines 131, 132, and 133 to heat the metallic material to a temperature which effectively causes a thermal anneal of the metallic material and thus, a conversion of the polycrystalline microstructure to the large grain microstructure. A laser process can heat the metallic material of the metallic lines 131, 132, and 133 to a relatively high temperature (e.g., in a range of 400~1200 degrees Celsius) in a short time frame (e.g., 20 nanoseconds to about 15 minutes). In this regard, the use of a laser process to irradiate and heat the metallic lines 131, 132, and 133 provides precise temperature control of the metallic material, while reducing potential thermal damage to surrounding features/components of the semiconductor device when laser processing the metallic material.

In addition, as noted above, since the sidewalls of the metallic lines 131, 132, and 133 are not covered by dielectric material or other materials, the heat treatment process occurs at the upper and sidewall surfaces of the metallic lines 131, 132, and 133, thereby facilitating recrystallization and grain growth from multiple free (exposed) surfaces of the metallic lines 131, 132, and 133. This is to be contrasted with conventional techniques in which thermal annealing of metal lines is performed with the metal lines surrounded by dielectric material of an ILD layer in which the metal lines are formed. With such conventional techniques, recrystallization and grain growth of the polycrystalline grain structure of the metal lines starts from the upper exposed surface of the metal lines, and continues downward to some point where recrystallization and grain growth decreases and can no longer be achieved, resulting in a polycrystalline microstructure of the metallic material remaining within the bottom portion of metallic lines. In the example embodiments described herein, grain growth occurs from the sidewalls and well as upper surfaces of the metallic lines 131, 132, and 133, ensuring that large grains are formed throughout the entire microstructure of the metallic lines 131, 132, and 133.

In one embodiment, as shown in FIGS. 7A and 7B, following the heat treatment, an average grain size of the microstructure of the annealed metallic lines 131, 132, and 133 is greater than an average size of the polycrystalline microstructure (FIGS. 6A and 6B) of the metallic lines 131, 132, and 133 prior to the heat treatment process. It is to be understood that the term "average grain size" as used herein is a well-known term of art, which denotes a parameter that can be estimated using known techniques. For example, one technique for estimating the average grain size of a given material is known as the "intercept" method. With this method, a straight line of a given length (L) is drawn through a micrograph of the crystal structure of the given material (e.g., a TEM (Transmission Electron Microscope) or STEM (Scanning Transmission Electron Microscope) microstructure image). The number of grains (N) that the straight line intersects is counted. The average grain size is then determined as (L)/(N).

In one embodiment, the average grain size of the metallic material of the metallic lines 131, 132, and 133 in along the length direction (Y-direction) of metallic lines is greater than a critical dimension (e.g., width) of the metallic lines 131, 132, and 133. The increase in average grain size of the metallic lines 131, 132, and 133 shown in FIGS. 7A and 7B serves to reduce the resistivity of the metallic lines 131, 132, and 133 as there are less grain boundaries (as compared to the polycrystalline microstructure shown in FIGS. 6A and 6B) and, therefore, less scattering of conduction electrons at grain boundaries.

Furthermore, as shown in FIG. 7A, the heat treatment process results in surface rounding of the upper surfaces of the metallic lines 131, 132, and 133. In particular, as shown in FIG. 7A, at the very least, the heat treatment process results in rounding of the upper corners of the metallic lines 131, 132, and 133. The surface rounding results from the heat treatment of the freely exposed metallic lines 131, 132, and 133 that are not physically constrained within dielectric material of an ILD layer. It has been discovered through experimentation that surface rounding of the metallic lines 131, 132, and 133 serves to reduce the surface scattering of conduction electrons and, thus, further decreases the resistivity of the metallic lines 131, 132, and 133.

Figure 8:
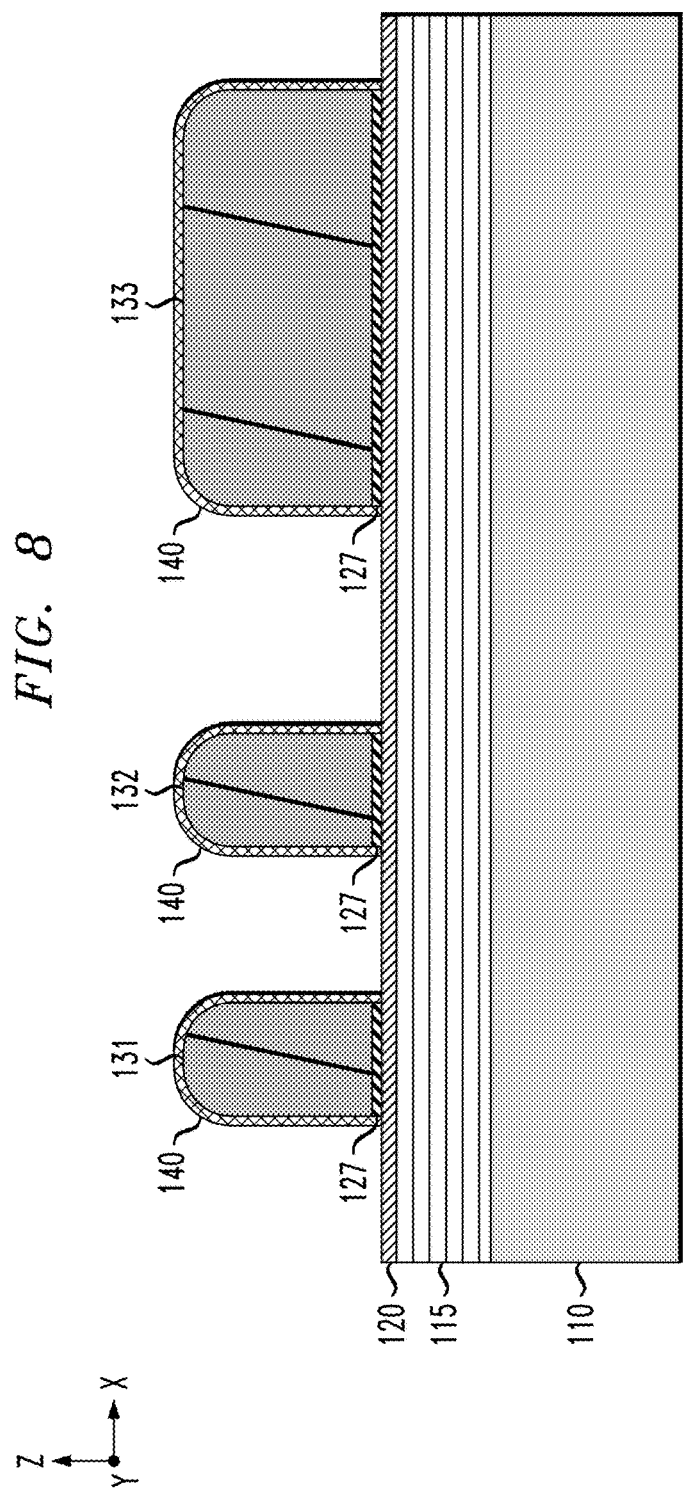

A next phase of the process flow comprises forming an ILD layer to encapsulate the metallic lines 131, 132, and 133 and complete the metallization level of the BEOL structure. As an initial step, FIG. 8 is a schematic cross-sectional side view of the semiconductor device shown in FIG. 7A after forming a liner layer 140 on exposed surfaces of the metallic lines 131, 132, and 133. In one embodiment, the liner layer 140 is formed by selectively depositing a thin conformal layer of liner material on the exposed surfaces of the metallic lines 131, 132, and 133. The selective deposition is performed so that the liner material is deposited only on the exposed surfaces of the metallic lines 131, 132, and 133, and not on other surfaces such as the capping layer 120. The liner layer 140 serves as barrier diffusion layer to prevent diffusion of metallic material of the metallic lines 131, 132, and 133 into a surrounding dielectric material of an ILD layer that is subsequently formed to encapsulate the metallic lines 131, 132, and 133.

In one embodiment, the liner layer 140 comprises a metallic material including, but not limited to, Co, Ru, W, Al, Ir, Ta, rhodium (Rh), and alloys thereof. The liner layer 140 can be selectively deposited using any suitable technique such as ALD, CVD, or electroless plating, which enables the selective formation of an ultra-thin, highly conformal, layer of liner material on the exposed surfaces of the metallic lines 131, 132, and 133. In on embodiment, the liner layer 140 is formed with a thickness in a range of about 0.5 nm to about 20 nm.

Figure 9:
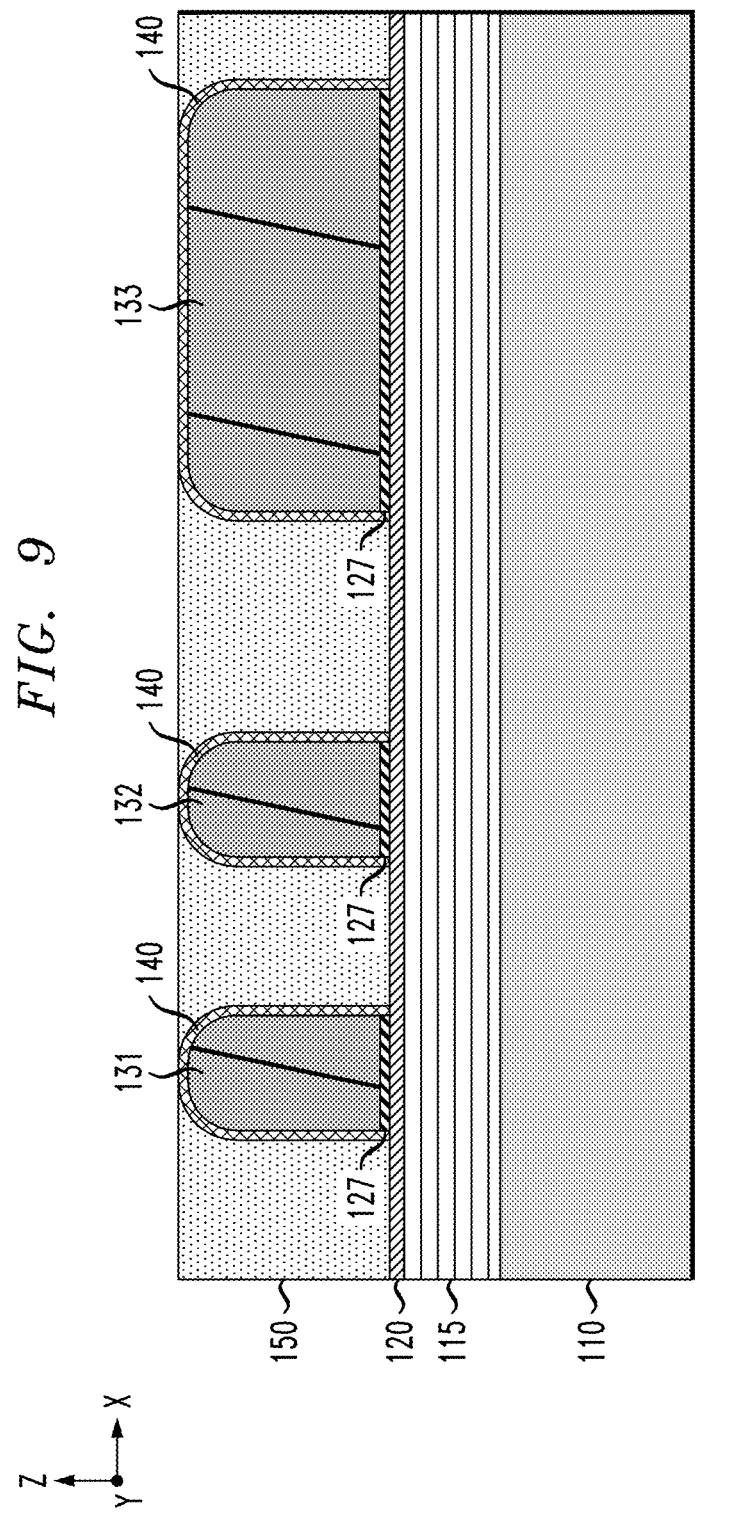

Next, FIG. 9 is a schematic cross-sectional side view of the semiconductor device shown in FIG. 8 after forming an ILD layer 150 to encapsulate the metallic lines 131, 132, and 133 in dielectric material. The ILD layer 150 is formed of any suitable dielectric material that is commonly utilized in BEOL process technologies. For example, the ILD layer 150 can be formed of a dielectric material including, but not limited to, silicon oxide ($SiO_2$), silicon nitride (e.g., ($Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The ILD layer 150 may be deposited using known deposition techniques, such as, for example, ALD, PVD, CVD, PECVD, or spin-on deposition.

It is to be noted that the process flow shown in FIGS. 8 and 9 significantly differs from conventional methods in which the ILD layer is first deposited and patterned to form openings (e.g., trenches), wherein the patterned openings in the ILD layer are then lined with a diffusion barrier layer, and then filled with metallic material to form metallic interconnect structures (e.g., metal lines or metal vias). In such conventional methods, the diffusion barrier layer is deposited on the patterned surface of the ILD layer and must formed with a thickness which is sufficient to accommodate for irregularities of the ILD surface topology, roughness, dielectric porosity, dielectric impurities, etc., to ensure that the diffusion barrier provides sufficient barrier diffusion protection.

In contrast, with the process flow shown in FIGS. 8 and 9, the liner layer 140 is selectively deposited directly on the exposed surfaces of the metallic lines 131, 132, and 133, followed by the deposition of the dielectric material to form the ILD layer 150. In this regard, the thickness of the barrier liner layer 140 can be minimized for its intended purposes, as the thickness of the barrier liner layer 140 does not need to be increased to accommodate for irregularities of the ILD surface topology, etc. As such, the metallic lines 131, 132, and 133 can be formed with a larger volume of metallic material and conducting area (due to thinner barrier liner layer 140), which further serves to reduce the resistivity of the metallic lines 131, 132, and 133. In other words, in contrast to conventional methods, the metallic lines 131, 132 and 133 are not formed by filling metallic material into openings (via openings or trenches) in an ILD layer, which are lined by a diffusion barrier that occupies volume in the opening and, thus, reduces the volume of the metallic material (e.g., copper) within the lined openings.

In another embodiment of the invention, a dielectric air-gap integration process can be implemented to form air gaps in the ILD layer between closely spaced metallic lines. For example, FIG. 10 is a schematic cross-sectional side view of the semiconductor device shown in FIG. 8 after forming an ILD layer 160 to encapsulate the metallic lines 131, 132, and 133, wherein an air gap 165 is formed in the ILD material between the metallic lines 131 and 132. The air gap 165 can be formed by depositing a layer of dielectric material over the semiconductor device shown in FIG. 8 using a non-conformal deposition process (e.g., chemical vapor deposition), which results in the formation of a "pinch-off" region in the layer of dielectric material above the small spaces between closely spaced metallic lines 131 and 132. The pinch-off regions prevent further deposition of the dielectric material between the closely spaced metallic lines 131 and 132, thereby forming the air gap 165.

In one embodiment of the invention, the ILD layer 160 is formed by PECVD deposition of SiN or SiCN. With this deposition process, the conformality of the dielectric material deposition is low so that while the ILD layer 160 fills the wider space between the metallic lines 132 and 133, a "pinch-off" region is formed in the ILD layer 160 above the space between the metallic lines 131 and 132, thereby forming the air gap 165. Following deposition of the dielectric material used to form the ILD layer 160, a CMP process may be performed to planarize the ILD layer 160 down to the liner layer 140 on the upper surface of the metal lines 131, 132, and 133, resulting in the planarized semiconductor device shown in FIG. 10. The dielectric constant of air is about unity, which is much less than the dielectric constant of the dielectric material of the ILD layer 160. As such, the resulting "air spacer" formed by the air gap 165 provide enhanced electrical performance by reducing parasitic capacitance between the closely spaced metallic lines 131 and 132.

It is to be understood that the methods discussed herein for fabricating low-resistivity metallic interconnect structures (e.g., copper BEOL interconnect structures) can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
   forming a sacrificial dielectric layer on a substrate;
   patterning the sacrificial dielectric layer to form an opening in the sacrificial dielectric layer;
   filling the opening with metallic material to form a metallic interconnect structure;
   removing the sacrificial dielectric layer to expose the metallic interconnect structure;
   applying a heat treatment process to heat the exposed metallic interconnect structure to (i) modulate a microstructure of the metallic material of the metallic interconnect structure from a first microstructure to a second microstructure, and to (ii) cause surface rounding of an upper surface of the metallic interconnect structure;
   performing a selective deposition process to selectively deposit a conformal liner layer on exposed surfaces of the metallic interconnect structure, subsequent to the heat treatment process, wherein the selective deposition is performed so that material forming the liner layer is deposited only on the exposed sidewall and upper surfaces of the metallic interconnect structure; and
   forming a dielectric layer to encapsulate the metallic interconnect structure in dielectric material,
   wherein the conformal liner layer comprises a diffusion barrier layer between the metallic interconnect structure and the dielectric layer.

2. The method of claim 1, wherein the metallic interconnect structure comprises one of a metallic via and a metallic line.

3. The method of claim 1, wherein the metallic material of the metallic interconnect structure comprises copper.

4. The method of claim 1, wherein the metallic material of the metallic interconnect structure comprises one of aluminum, tungsten, iridium, cobalt, and ruthenium.

5. The method of claim 1, wherein applying the heat treatment comprises thermally annealing the metallic interconnect structure in a furnace.

6. The method of claim 1, wherein applying the heat treatment comprises applying laser radiation to the metallic interconnect structure to heat the metallic interconnect structure.

7. The method of claim 1, wherein applying the heat treatment process to cause the surface rounding of the upper surface of the metallic interconnect structure comprises rounding upper corners of the metallic interconnect structure.

8. The method of claim 1, wherein the first microstructure comprises a polycrystalline microstructure and wherein the second microstructure comprises an average grain size which is greater than an average grain size of the polycrystalline microstructure.

9. The method of claim 1, wherein an average grain size of the second microstructure of the metallic interconnect structure is greater than a critical dimension of the metallic interconnect structure.

10. The method of claim 1, wherein end portions of grain boundaries of the second microstructure of the metallic interconnect structure extend from an upper surface to a bottom surface of the metallic interconnect structure.

11. The method of claim 1, wherein the dielectric layer comprises an interlayer dielectric (ILD) layer of a back-end-of-line (BEOL) structure.

12. The method of claim 1, wherein the conformal liner layer comprises one of cobalt, ruthenium, tungsten, aluminum, iridium, rhodium, tantalum, and alloys thereof.

13. The method of claim 1, wherein forming the dielectric layer to encapsulate the metallic interconnect structure in dielectric material, comprises depositing a non-conformal layer of dielectric material to form an air gap in the dielectric layer adjacent to the metallic interconnect structure.

14. A device, comprising:
   a dielectric layer disposed on a substrate;
   a metallic interconnect structure encapsulated in the dielectric layer;
   wherein the metallic interconnect structure comprises a conformal liner layer formed on an upper surface and sidewall surfaces of the metallic interconnect structure, wherein the conformal liner layer comprises a diffusion barrier layer between the metallic interconnect structure and the dielectric layer;
   wherein the metallic interconnect structure comprises metallic material having an average grain size which is greater than a critical dimension of metallic interconnect structure;
   wherein the metallic interconnect structure comprises a rounded upper surface; and
   wherein the conformal liner layer comprises a conformal rounded portion which is disposed on the rounded upper surface of the metallic interconnect structure.

15. The device of claim 14, wherein the metallic interconnect structure comprises one of a metallic via, a metallic line, and both a metallic via and a metallic line.

16. The device of claim 14, wherein end portions of grain boundaries of the metallic material of the metallic interconnect structure extend from an upper surface to a bottom surface of the metallic interconnect structure.

17. The device of claim 14, wherein the dielectric layer comprises an interlayer dielectric (ILD) layer of a back-end-of-line (BEOL) structure.

18. The device of claim 14, wherein the metallic interconnect structure comprises copper.

19. The device of claim 14, wherein the conformal liner layer comprises one of cobalt, ruthenium, tungsten, aluminum, iridium, rhodium, tantalum, and alloys thereof.

20. The device of claim 14, wherein the conformal liner layer is formed with a thickness in a range of about 0.5 nm to about 20 nm.

* * * * *